United States Patent
Vest et al.

(10) Patent No.: US 9,703,201 B2
(45) Date of Patent: Jul. 11, 2017

(54) METHOD OF MAKING RELIEF IMAGE PRINTING PLATES

(71) Applicant: MacDermid Printing Solutions, LLC, Waterbury, CT (US)

(72) Inventors: Ryan W. Vest, Cumming, GA (US); Christine Anderson, Atlanta, GA (US)

( * ) Notice: Subject to any disclaimer, the term of this patent is extended or adjusted under 35 U.S.C. 154(b) by 0 days.

(21) Appl. No.: 14/693,062

(22) Filed: Apr. 22, 2015

(65) Prior Publication Data

US 2016/0311214 A1 Oct. 27, 2016

(51) Int. Cl.
*G03F 7/40* (2006.01)
*G03F 7/20* (2006.01)

(52) U.S. Cl.
CPC ............ *G03F 7/40* (2013.01); *G03F 7/2002* (2013.01)

(58) Field of Classification Search
CPC ........................................................ G03F 1/14
USPC ........................................................ 430/306
See application file for complete search history.

(56) References Cited

U.S. PATENT DOCUMENTS

| | | | |
|---|---|---|---|
| 3,537,853 A | 11/1970 | Wessells et al. | |
| 3,597,080 A * | 8/1971 | Gush | G03F 7/3014 355/85 |
| 3,794,494 A | 2/1974 | Kai et al. | |
| 3,960,572 A | 6/1976 | Ibata et al. | |
| 4,442,302 A | 4/1984 | Pohl | |
| 5,213,949 A | 5/1993 | Kojima et al. | |
| 5,813,342 A | 9/1998 | Strong | |
| 2008/0107908 A1 | 5/2008 | Long et al. | |
| 2009/0197013 A1 * | 8/2009 | Gouch | B41C 1/003 427/558 |
| 2012/0082932 A1 * | 4/2012 | Battisti | G03F 1/68 430/270.1 |
| 2013/0299471 A1 * | 11/2013 | Vest | B41C 1/05 219/121.69 |
| 2014/0057207 A1 * | 2/2014 | Baldwin | G03F 7/201 430/306 |
| 2014/0080042 A1 * | 3/2014 | Maneira | G03F 1/50 430/5 |

FOREIGN PATENT DOCUMENTS

DE 102011076625 A1 * 1/2012 ........... G03F 7/2051

OTHER PUBLICATIONS

Masuhara et al. (Nanophotonics: Integrating Photochemistry, Optics and Nano/Bio Materials Studies, vol. 1, p. 191 (2004)).*

* cited by examiner

*Primary Examiner* — Chanceity Robinson
(74) *Attorney, Agent, or Firm* — Carmody Torrance Sandak & Hennessey LLP

(57) ABSTRACT

A method of selectively exposing a liquid photopolymer printing blank to actinic radiation to create a relief image printing plate. The printing blank is produced by (i) placing a photographic negative on a bottom glass platen and placing a coverfilm over the negative, (ii) disposing a layer of liquid photopolymer on top of the coverfilm and negative, and (iii) placing a backing sheet over the liquid photopolymer layer. The method includes the steps of scanning a light bar across an upper surface of the liquid photopolymer printing blank through the backing sheet to cure the layer of liquid photopolymer in selected areas, creating islands of cured polymer adjacent to the backing sheet, and imaging the photopolymer through the bottom of the liquid photopolymer printing blank to crosslink and cure selective portions of the liquid photopolymer and create a relief image therein. The relief image is created on the cured islands.

21 Claims, No Drawings

METHOD OF MAKING RELIEF IMAGE PRINTING PLATES

FIELD OF THE INVENTION

The present invention relates generally to an improved method of producing flexographic printing plates using liquid photopolymers.

BACKGROUND OF THE INVENTION

Flexographic printing is widely used in the production of newspapers and in the decorative printing of packaging media. Numerous photosensitive printing plate formulations have been developed to meet the demand for fast, inexpensive processing and long press runs.

Photosensitive printing elements generally comprise a support layer, one or more photosensitive layers, an optional slip film release layer, and an optional protective cover sheet. The protective cover sheet is formed from plastic or any other removable material that can protect the plate or photocurable element from damage until it is ready for use. If used, the slip film release layer is typically disposed between the protective cover sheet and the photocurable layer(s) to protect the plate from contamination, increase ease of handling, and act as an ink-accepting layer. After exposure and development, the photopolymer flexographic printing plate consists of various image elements supported by a floor layer and anchored to a backing substrate.

It is highly desirable that flexographic printing plates work well under a wide range of conditions. For example, the printing plates should be able to impart their relief image to a wide range of substrates, including cardboard, coated paper, newspaper, calendared paper, and polymeric films such as polypropylene. Importantly, the image should be transferred quickly and with fidelity, for as many prints as the printer desires to make.

Flexographic printing elements can be manufactured in various ways including with sheet polymers and by the processing of liquid photopolymer resins. Flexographic printing elements made from liquid photopolymer resins have the advantage that uncured resin can be reclaimed from the non-image areas of the printing elements and used to make additional printing plates. Liquid photopolymer resins have a further advantage as compared to sheet polymer in terms of flexibility, which enables the production of any required plate gauge simply by changing the machine settings.

Various processes have been developed for producing printing plates from liquid photopolymer resins as described, for example, in U.S. Pat. No. 5,213,949 to Kojima et al., U.S. Pat. No. 5,813,342 to Strong et al., U.S. Pat. Pub. No. 2008/0107908 to Long et al., and in U.S. Pat. No. 3,597,080 to Gush, the subject matter of each of which is herein incorporated by reference in its entirety.

Typical steps in the liquid platemaking process include:
(1) casting and exposure;
(2) reclamation;
(3) washout;
(4) post exposure;
(5) drying; and
(6) detackification.

In the casting and exposure step, a photographic negative is placed on a bottom glass platen and a coverfilm is placed over the negative in an exposure unit. The exposure unit generally comprises the bottom glass patent with a source of UV light below it (lower light) and a lid having flat top glass platen with a source of UV light above it (upper light).

All of the air is removed by vacuum so that any wrinkling of the negative or coverfilm can be eliminated. In addition, the bottom glass platen may be grooved to further remove any air between the coverfilm and the negative. Thereafter, a layer of liquid photopolymer and a backing sheet (i.e., a thin layer of polyester or polyethylene terephthalate) are cast on top of the coverfilm and negative to a predetermined thickness. A backing sheet, which may be coated on one side to bond with the liquid photopolymer, is laminated over the cast liquid photopolymer layer to serve as the back of the plate after exposure.

Upper and/or lower sources of actinic radiation (i.e., the upper and lower lights) are used to expose the photopolymer to actinic radiation to selectively crosslink and cure the liquid photopolymer layer in the areas not covered by the negative. The top sources of actinic radiation are used to create the floor layer of the printing plate (i.e., back exposure) while the bottom sources of actinic radiation are used to face expose the photopolymer to actinic radiation through the negative to create the relief image. Plate gauge may be set by positioning a top exposure glass at a desired distance from a bottom exposure glass after dispensing liquid photopolymer on the protected bottom exposure glass.

The upper light source is turned on for a prescribed amount of time to cause the photopolymer adjacent to the substrate to crosslink uniformally over the entire surface of the plate, forming the floor. Thereafter, areas to be imaged are exposed to actinic radiation from the lower light source (i.e., through the bottom glass platen). The actinic radiation shines through the clear areas of the negative, which causes the photopolymer to crosslink in those areas, forming the relief image that bonds to the floor layer. The liquid photopolymer that is not exposed to the lower light source (i.e., the uncured photopolymer) remains in a liquid state and can be reclaimed and reused.

After the exposure is complete, the printing plate is removed from the exposure unit and the photopolymer that was not exposed to actinic radiation (i.e., the photopolymer covered by the negative) remains liquid and can be reclaimed for further use. In liquid platemaking, resin recovery is an important factor relating to the production of photopolymerizable resin printing plates because the resins used to produce the plates are relatively expensive. In all areas not exposed to UV radiation, the resin remains liquid after exposure and can then be reclaimed. In a typical process, the uncured resin is physically removed from the plate in a process step so that the uncured resin can be reused in making additional plates. This "reclamation" step typically involves squeegeing, vacuuming or otherwise removing liquid photopolymer remaining on the surface of the printing plate. This reclamation step not only saves material costs of the photopolymer resin but also reduces the use and cost of developing chemistry and makes a lighter plate that is safer and easier to handle.

Any residual traces of liquid resin remaining after the reclamation step may then be removed by nozzle washing or brush washing using a wash-out solution to obtain a washed-out plate, leaving behind the cured relief image. Typically, the plate is placed into a washout unit wherein an aqueous solution comprising soap and/or detergent is used to wash away any residual unexposed photopolymer. The plate is then rinsed with water to remove any residual solution.

After the washout step has been completed, the printing plate is subjected to various post exposure and detackification steps. Post exposure may involve submerging the plate in a water and salt solution and performing an additional exposure of the printing plate to actinic radiation (UV light) to fully cure the printing plate and to increase plate strength. The printing plate may then be rinsed and dried by blowing hot air onto the plate, by using an infrared heater or by placing the printing plate into a post exposure oven.

If used, the detackification step may involve the use of a germicidal unit (light finisher) to ensure a totally tack-free plate surface. This step is not require for all plates, as certain resins may be tack-free and thus printing press ready without the need for the detackification step.

In a variation on the above described process, instead of making a floor that extends over the entire plate, a second photographic negative is placed on top of the photopolymer layer. This negative (also referred to as a masking film) outlines the image areas on the negative. The plates are first exposed to the upper UV light from the lid through the masking negative, causing islands of cured polymer to be formed beginning in the photosensitive layer adjacent to the substrate. The timing and intensity of the exposure are limited to prevent the polymerization extending all the way through the photopolymer layer from the substrate to the free surface of the layer. The second lower UV exposure, from below the relief image negative, then causes the cured detailed relief image to form on top of the islands thus created, as described for example in U.S. Pat. Pub. No. 2012/0082932 to Battisti et al. and U.S. Pat. Pub. No. 2014/0080042 to Maneira, the subject matter of each of which is herein incorporated by reference in its entirety.

Once the image has been created in the photopolymer layer, residual traces of liquid resin remaining in the regions of the resin that were protected from actinic radiation by the opaque regions of the transparency can be washed away using a developer solution. The cured regions of the printing element are insoluble in the developer solution, and so after development, a relief image formed of cured photopolymerizable resin is obtained. The cured resin is likewise insoluble in certain inks, and thus may be used in flexographic printing. The liquid photopolymerizable resin may also be exposed to actinic radiation from both sides of the resin layer.

The type of radiation used is dependent in part on the type of photoinitiator in the photopolymerizable layer. The digitally-imaged mask or photographic negative prevents the material beneath from being exposed to the actinic radiation and hence those areas covered by the mask do not polymerize, while the areas not covered by the mask are exposed to actinic radiation and polymerize. Any conventional sources of actinic radiation can be used for this exposure step. Examples of suitable visible and UV sources include carbon arcs, mercury-vapor arcs, fluorescent lamps, electron flash units, electron beam units, and photographic flood lamps.

The use of ultraviolet mercury arc lamps that emit ultraviolet light suitable to cure photocurable layers is well known. Ultraviolet arc lamps emit light by using an electric arc to excite mercury that resides inside an inert gas (e.g., argon) environment to generate ultraviolet light which effectuates curing. Alternatively, microwave energy can also be used to excite mercury lamps in an inert gas medium to generate the ultraviolet light. However, the use of ultraviolet mercury lamps as a radiation source suffers from several disadvantages including environmental concerns from mercury and the generation of ozone as a by-product. Further, mercury lamps typically have lower energy conversion ratio, require warm-up time, generate heat during operation, and consume a large amount of energy. In addition, mercury lamps are characterized by a broad spectral output, in addition to the UV radiation, much of which is not useful for curing and can damage substrates and presents hazards to personnel.

LEDs are semiconductor devices which use the phenomenon of electroluminescence to generate light. LEDs consist of a semiconducting material doped with impurities to create a p-n junction capable of emitting light as positive holes join with negative electrons when voltage is applied. The wavelength of emitted light is determined by the materials used in the active region of the semiconductor. Typical materials used in semiconductors of LEDs include, for example, elements from Groups (III) and (V) of the periodic table. These semiconductors are referred to as III-V semiconductors and include, for example, GaAs, GaP, GaAsP, AlGaAs, InGaAsP, AlGaInP and InGaN semiconductors. The choice of materials is based on multiple factors including desired wavelength of emission, performance parameters and cost.

While various methods of exposing liquid photopolymer printing plates have been developed, there remains a need in the art for an improved method of exposing liquid photopolymer printing plates that does not require a mask for an in-position plate framework.

SUMMARY OF THE INVENTION

It is an object of the present invention to provide an improved means of consistently imaging a liquid flexographic printing element.

It is another object of the present invention to provide a means of improving intensity over time.

It is another object of the present invention to provide a means of improving product consistency over time.

It is still another object of the present invention to omit the need for a negative masking film or other masking technique in an in-position platemaking process.

It is still another object of the present invention to save in film cost and mask preparation time in the plate making process.

To that end, the present invention relates generally to a method of selectively exposing a liquid photopolymer printing blank to actinic radiation to create a relief image printing plate, wherein the liquid photopolymer printing blank is produced by the steps of (i) placing a photographic negative on a bottom glass platen and placing a coverfilm over the negative, (ii) disposing a layer of liquid photopolymer on top of the coverfilm and negative to a predetermined thickness, and (iii) placing a backing sheet over the liquid photopolymer layer, the method comprising the steps of:

a) scanning a light bar comprising a plurality of UV LEDs across an upper surface of the liquid photopolymer printing blank through the backing sheet to cure the layer of liquid photopolymer in selected areas, creating islands of cured polymer adjacent to the backing sheet;

b) thereafter, imagewise exposing the layer of liquid photopolymer to actinic radiation through the bottom of the liquid photopolymer printing blank through the photographic negative to crosslink and cure selective portions of the liquid photopolymer and create a relief image therein;

wherein the relief image is created on the cured islands;
wherein the light bar(s) comprise a plurality of UV LEDs, and wherein a controller operatively connected to the light bar(s) selectively turns on and off the UV LEDs in a manner corresponding to an image to be created as the light bar scans across the surface of the layer of the liquid photopolymer, whereby islands of cured polymer and created without using a mask.

In addition, in another embodiment, the present invention also relates generally to a method of selectively exposing a liquid photopolymer printing blank to actinic radiation to create a relief image printing plate, wherein the liquid photopolymer printing blank is produced by the steps of (i) placing a cover film on a bottom glass platen, (ii) disposing a layer of liquid photopolymer on top of the coverfilm to a predetermined thickness, and (iii) placing a backing sheet over the liquid photopolymer layer, the method comprising the steps of:

a) scanning an upper light bar comprising a plurality of UV LEDs across an upper surface of the liquid photopolymer printing blank through the backing sheet to cure the layer of liquid photopolymer in selected areas, creating islands of cured polymer adjacent to the backing sheet;

b) thereafter, imaging the photopolymer through the bottom of the liquid photopolymer printing blank through the cover film by scanning a lower light bar comprising a plurality of UV LEDs across a lower surface of the liquid photopolymer printing blank through the cover film to crosslink and cure selective portions of the liquid photopolymer and create a relief image therein;

wherein the relief image is created on the cured islands;

wherein the light bar(s) comprise a plurality of UV LEDs, and wherein a controller operatively connected to the light bar(s) selectively turns on and off the UV LEDs in a manner corresponding to an image to be created as the light bar scans across the surface of the layer of the liquid photopolymer, whereby islands of cured polymer and created without using a mask.

DETAILED DESCRIPTION OF THE PREFERRED EMBODIMENTS

The present invention relates generally to an improved method of exposing liquid flexographic printing elements in an in-position framework that eliminates the need for a negative or other masking technique in creating islands in the photopolymer layer adjacent to the substrate from the upper UV light source.

In one embodiment, the present invention relates generally to a method of selectively exposing a liquid photopolymer printing blank to actinic radiation to create a relief image printing plate, wherein the liquid photopolymer printing blank is produced by the steps of (i) placing a photographic negative on a bottom glass platen and placing a coverfilm over the negative, (ii) disposing a layer of liquid photopolymer on top of the coverfilm and negative to a predetermined thickness, and (iii) placing a backing sheet over the cast liquid photopolymer layer, the method comprising the steps of:

a) scanning a light bar comprising a plurality of UV LEDs across an upper surface of the liquid photopolymer printing blank through the backing sheet to cure the layer of liquid photopolymer in selected areas, creating islands of cured polymer adjacent to the backing sheet;

b) thereafter, imagewise exposing the layer of liquid photopolymer to actinic radiation through the bottom of the liquid photopolymer printing blank through the photographic negative to crosslink and cure selective portions of the liquid photopolymer and create a relief image therein;

wherein the relief image is created on the cured islands;

wherein the light bar(s) comprise a plurality of UV LEDs, and wherein a controller operatively connected to the light bar(s) selectively turns on and off the UV LEDs as the light bar(s) scan across the surface of the layer of liquid photopolymer, and whereby the islands of cured polymer are created without a mask.

As described herein, the present invention uses UV LEDs to cure the photopolymer without the need for a negative or other masking technique. The light bar comprises a plurality of UV LEDs. While the number of UV LEDs on the light bar is not critical, it is important that there are a sufficient number of UV LEDs arranged across the width of the light bar so that as the light bar scans over the surface of the liquid photopolymer printing blank, substantially the entirety of the width surface of the liquid photopolymer printing blank may be subjected to crosslinking and curing to create cured islands at any point therein. Thus, depending on the width of the photopolymer printing blank to be imagewise exposed to actinic radiation, the number of UV LEDs is at least three, and is preferably at least five or more, depending also on the size, intensity, wavelength and placement of the UV LEDs on the light bar.

In addition, the light bar also comprises a controller, preferably a microcontroller, operatively connected thereto. The microcontroller controls each of the individual UV LEDs on the light bar to selectively turn on/off each of the plurality of UV LEDs as the light bar scans across a surface of the photopolymer so that islands or an in-position frame of cured polymer can be created in the liquid photopolymer layer without the use of a negative masking film or any sort of masking technique. By controlling the individual UV LEDs, the controller controls the size and thickness of the islands created in the layer of photopolymer. The microcontroller controls whether the individual LEDs on the light bar are on/off, the duration of time they are on/off and the intensity of the individual LEDs. The result is individualized control of the UV LEDs.

The microcontroller also comprises software for controlling the operation of the UV LEDs and data storage means for storing data related to the UV LEDs. A user interface is operatively connected to the microcontroller and to the UV LEDs and comprises means for entering data into the data storage means and means for selecting information relating to the UV LEDs. The user interface comprises a touch screen and the microcontroller stores information relating to the number/size/shape/depth of the islands to be created in the photopolymer adjacent to the substrate.

The islands created in the layer of liquid photopolymer are optimized to have a thickness that is less than the thickness of the layer of photopolymer in the liquid photopolymer printing blank so that the desired relief image may be created in the remaining thickness of the layer of liquid photopolymer. In other words, the islands created in the layer of liquid photopolymer create a "floor" for the desired relief image to be created thereon. The benefit of the present invention is that more of the liquid photopolymer can be reclaimed because islands are only created in areas of the printing plate in which it is desired to create the relief image. Unlike conventional processes in which a floor layer is created across the entirety of the relief image printing plate, in the present invention the floor comprises only the cured islands of photopolymer that are created on the substrate layer.

After the desired relief image is created in the relief image printing plate by selectively crosslinking and curing portions of the layer of liquid photopolymer, the uncured (i.e., liquid) photopolymer remaining on the surface of the relief image may be removed by various methods, including squeegeeing or vacuuming the liquid photopolymer from the relief surface of the relief image printing plate. The light bars may subsequently be used for post exposure curing and/or detackification of the imaged printing plate The photopolymer resin for use in the layer of liquid photopolymer may be any material which is both fluid when uncured and that hardens upon exposure to selective wavelengths of actinic radiation. Such photopolymer resins are very commonly used in the photopolymer printing plate making industry, and are thus well known to those skilled in that art. One or more different photopolymer resins or resin compositions may be employed.

Any liquid photopolymer resin that is a fluid when uncured and that hardens upon exposure to selective wavelengths of actinic radiation may be used in the practice of the present invention. Examples of liquid curable photopolymer resins include those described in U.S. Pat. No. 3,537,853 to Wessells et al., U.S. Pat. No. 3,794,494 to Kai et al., U.S. Pat. No. 3,960,572 to Ibata et al. and U.S. Pat. No. 4,442,302 to Pohl, the subject matter of each of which is herein incorporated by reference in its entirety. The liquid photopolymer resin may also include additives such as antioxidants, accelerators, dyes, inhibitors, activators, fillers, pigments, antistatic agents, flame-retardant agents, thickeners, thixotropic agents, surface active agents, light scattering agents, viscosity modifiers, extending oils, plasticizers, and detackifiers, by way of example and not limitation. These additives may be pre-blended with one or monomers or other compounds to be polymerized. Various fillers, including for example, natural and synthetic resins, carbon black, glass fibers, wood flour, clay, silica, alumina, carbonates, oxides, hydroxides, silicates, glass flakes, glass beads, borates, phosphates, diatomaceous earth, talc, kaolin, barium sulfate, calcium sulfate, calcium carbonate, antimony oxide, etc. may also be included in the photopolymer composition in amounts that will not interfere with or otherwise inhibit the photocuring reaction or other steps in the platemaking process.

Preferably, the coverfilm that is placed on the exposure glass is either a biaxially oriented polypropylene (BOPP) film, a polyester film, or a polyethylene terephthalate (PET) film and is preferably transparent to actinic radiation. To aid in removal, the coverfilm may be treated with a release agent such as a silicone release agent or other release agent known in the art. Also, in a preferred embodiment, a vacuum is drawn on the coverfilm in order to remove creases and hold it in place on the exposure glass. The imagewise exposure to actinic radiation is from the frontside of the photopolymerizable layer and includes the image or film negative being placed on the coverfilm layer.

The photopolymer resin layer is then disposed over the coverfilm and negative. This step may preferably be accomplished by casting. Substantially simultaneously with casting the photopolymer resin layer, a backing sheet is laminated or otherwise placed on the photopolymer resin layer. This backing sheet may preferably comprise a material selected from the group consisting of polyester films, acrylic films, acrylonitrile-butadiene-styrene resins, phenolic resins, and combinations of one or more of the foregoing, given by way of example rather than limitation. This backing sheet should be transparent or translucent to actinic radiation. In addition, if desired, the backing sheet may be coated so that the liquid photopolymer more securely bonds to the backing sheet.

Various means are known in the art for dispensing the liquid photopolymer layer onto the negative on the glass platen and for removing entrapped air or gases in the liquid photopolymer layer so that gas bubbles are not formed in the photopolymer layer that would adversely affect printing performance. In addition, as described in U.S. Pat. No. 3,597,080, a heating element may be provided to maintain the fluidity of the liquid photopolymer composition in the storage tank housing and prevent the liquid photopolymer composition from congealing on a doctor blade which is provided to remove excess composition from the glass platen.

The UV LEDs may additionally be placed in the light bar to imagewise expose the layer of liquid photopolymer and create the relief image therein. Thus, it is contemplated that the process described herein can be an all UV LED system in which both the upper light bar and the lower light bar utilize UV LEDs as the source of actinic radiation for crosslinking and curing the layer of liquid photopolymer. In the alternative, it is also contemplated that a mixed system can be used in which UV LEDs are used in the upper light bar and a conventional source of actinic radiation is used as the lower light source. Furthermore, if UV LEDs are used in the lower light bar, they may be used in a similar fashion as the upper source of UV LEDs in which a mask is not used but rather the creation of the features (i.e., the relief image) is controlled by a controller or alternatively in a conventional fashion in which the UV LEDs are used to imagewise exposure the layer of photopolymer through the negative to create the relief image therein.

As described herein, in another embodiment, the present invention relates generally to a method of selectively exposing a liquid photopolymer printing blank to actinic radiation to create a relief image printing plate, wherein the liquid photopolymer printing blank is produced by the steps of (i) placing a cover film on a bottom glass platen, (ii) disposing a layer of liquid photopolymer on top of the coverfilm to a predetermined thickness, and (iii) placing a backing sheet over the liquid photopolymer layer, the method comprising the steps of:
  a) scanning an upper light bar comprising a plurality of UV LEDs across an upper surface of the liquid photopolymer printing blank through the backing sheet to cure the layer of liquid photopolymer in selected areas, creating islands of cured polymer adjacent to the backing sheet;
  b) thereafter, imaging the photopolymer through the bottom of the liquid photopolymer printing blank through the cover film by scanning a lower light bar comprising a plurality of UV LEDs across a lower surface of the liquid photopolymer printing blank through the cover film to crosslink and cure selective portions of the liquid photopolymer and create a relief image therein;
  wherein the relief image is created on the cured islands.

In this instance, both the upper light bar and the lower light bar comprise a plurality of UV LEDs, and a controller operatively connected to each of the upper light bar and the lower light bar selectively turns on/off the UV LEDs on the respective light bar as the respective light bar scans across an upper or lower surface of the photopolymer, so that the layer of liquid photopolymer can be selectively exposed to actinic radiation without the use of a mask.

It is possible to create LEDs that emit light anywhere from a low of about 100 nm to a high of about 900 nm. Currently, known LED UV light sources emit light at wavelengths between about 300 and about 475 nm, with 365 nm, 390 nm and 395 nm being common peak spectral outputs. When using LED lamps for curing photocurable compositions, the photoinitiator in the photopolymer composition is selected to be responsive to the wavelength of light emitted by the LED lamps and the wavelength of the UV LEDs is generally chosen to match the particularly photopolymer being cured. The UV LED's used on the light bars can be all of the same wavelength or they can be varied so that some of the UV LED's emit light at one wavelength and other UV LED's emit light at another wavelength. The inventors have found that the use of varied wavelength UV LED's can assist in tailoring the cure reaction of the photopolymer to achieve specific results such as the level of cure, shape of the cured features, rate of cure and definition achieved.

Thus, the UV LEDs in both the upper light bar and the lower light bar preferably emit light at a wavelength of between about 300 and about 475 nm, and more preferably emit light at a wavelength between about 365 and about 405 nm. In addition, the wavelength of the UV LEDs in the upper light bar and the lower light bar (if used) may be the same or different. In addition, if desired UV LEDs of different wavelengths and/or different intensities may be used in combination along the light bar. In addition, while the arrangement of UV LEDs across the light bar(s) can be varied, configurations in which the UV LEDs are arranged in one or more rows across the width of the light bar or in which the UV LEDs are arranged in a zigzag row or another arrangement would usable in the present invention. Other similar arrangements or arrays of UV LEDs can also be used.

The present invention provides a significant savings in film cost and mask preparation time over the techniques of the prior art. The inventors of the present invention have also found that the use of UV LEDs is advantageous with respect to their intensity consistency over time and in improving product consistency over a long period of time as compared with existing fluorescent/bank light approaches.

It should also be understood that the following claims are intended to cover all of the generic and specific features of the invention described herein and all statements of the scope of the invention that as a matter of language might fall there between.

What is claimed is:

1. A method of selectively exposing a liquid photopolymer printing blank to actinic radiation to create a relief image printing plate, wherein the liquid photopolymer printing blank is produced by the steps of (i) placing a photographic negative on a bottom glass platen and placing a coverfilm over the negative, (ii) disposing a layer of liquid photopolymer on top of the coverfilm and negative to a predetermined thickness, and (iii) placing a backing sheet over the layer of liquid photopolymer, the method comprising the steps of:
   a) scanning a light bar across an upper surface of the liquid photopolymer printing blank through the backing sheet to cure the layer of liquid photopolymer in selected areas, creating islands of cured polymer adjacent to the backing sheet;
   b) thereafter, imagewise exposing the layer of liquid photopolymer to actinic radiation through the bottom of the liquid photopolymer printing blank through the photographic negative to crosslink and cure selective portions of the layer of liquid photopolymer and create a relief image therein;
   wherein the relief image is created on the islands of cured polymer; and wherein the light bar comprises a plurality of UV LEDs, and wherein a controller operatively connected to the light bar selectively turns on and off the plurality of UV LEDs as the light bar scans across a surface of the layer of liquid photopolymer to selectively crosslink and cure portions of the layer of liquid photopolymer, whereby the islands of cured polymer are created without the use of a masking film or negative.

2. The method according to claim 1, wherein the islands of cured polymer have a thickness that is less than the thickness of the layer of liquid photopolymer in the liquid photopolymer printing blank.

3. The method according to claim 1, wherein the controller controls the size and thickness of the islands of cured polymer created in the layer of liquid photopolymer.

4. The method according to claim 1, wherein the backing sheet is coated, wherein the layer of liquid photopolymer is bonded to the backing sheet.

5. The method according to claim 1, further comprising the step of removing the layer of liquid photopolymer remaining on the relief image printing plate after the relief image has been created therein.

6. The method according to claim 5, wherein the layer of liquid photopolymer is removed by squeegeeing or vacuuming the layer of liquid photopolymer from the surface of the relief image printing plate.

7. The method according to claim 1, wherein the plurality of UV LEDs emit light at a wavelength of between 300 and 475 nm.

8. The method according to claim 7, wherein the plurality of UV LEDs emit light at a wavelength between 365 and 405 nm.

9. The method according to claim 1, wherein the source of actinic radiation in step b) is a plurality UV LEDs.

10. A method of selectively exposing a liquid photopolymer printing blank to actinic radiation to create a relief image printing plate, wherein the liquid photopolymer printing blank is produced by the steps of (i) placing a cover film on a bottom glass platen, (ii) disposing a layer of liquid photopolymer on top of the coverfilm to a predetermined thickness, and (iii) placing a backing sheet over the layer of liquid photopolymer, the method comprising the steps of:
   a) scanning an upper light bar across an upper surface of the liquid photopolymer printing blank through the backing sheet to cure the layer of liquid photopolymer in selected areas, creating islands of cured polymer adjacent to the backing sheet;
   b) thereafter, imaging the layer of liquid photopolymer through the bottom of the liquid photopolymer printing blank through the cover film by scanning a lower light bar across a lower surface of the layer of liquid photopolymer printing blank through the cover film to crosslink and cure selective portions of the layer of liquid photopolymer and create a relief image therein;
   wherein the relief image is created on the islands of cured polymer, wherein the upper light bar and the lower light bar each comprises a plurality of UV LEDs, and wherein a controller operatively connected to each of the upper light bar and the lower light bar selectively turns on/off the UV LEDs on the respective light bar as the respective light bar scans across an upper or lower surface of the liquid photopolymer printing blank to selectively crosslink and cure portions of the layer of liquid photopolymer, wherein the layer of liquid photopolymer is selectively exposed to actinic radiation without the use of a masking film or negative.

11. The method according to claim 10, wherein the islands of cured polymer have a thickness that is less than the thickness of the layer of liquid photopolymer in the liquid photopolymer printing blank.

12. The method according to claim 10, wherein the controller independently controls the size and thickness of the islands of cured polymer created in the layer of liquid photopolymer and the relief image created in the relief image printing plate.

13. The method according to claim 10, wherein the backing sheet is coated, wherein the layer of liquid photopolymer is bonded to the backing sheet.

14. The method according to claim 10, further comprising the step of removing the layer of liquid photopolymer remaining on the relief image printing plate after the relief image has been created therein.

15. The method according to claim 14, wherein the layer of liquid photopolymer is removed by squeegeeing or vacuuming the layer of liquid photopolymer from the relief surface of the relief image printing plate.

16. The method according to claim 10, wherein the plurality of UV LEDs in the upper light bar and the plurality of UV LEDs in the lower light bar emit light at a wavelength of between 300 and 475 nm.

17. The method according to claim 10 wherein the plurality of UV LEDs in the upper light bar and the plurality of UV LEDs in the lower light bar emit light at a wavelength between 365 and 405 nm.

18. The method according to claim 1 wherein the plurality of UV LED's comprise some UV LED's which emit light at a first wavelength and some UV LED's that emit light at a second wavelength, wherein the first wavelength and the second wavelength are different.

19. The method according to claim 10 wherein the plurality of UV LED's comprise some UV LED's which emit light at a first wavelength and some UV LED's that emit light at a second wavelength, wherein the first wavelength and the second wavelength are different.

20. The method according to claim 1 wherein the light bar is used to further cure the relief image after step (b).

21. The method according to claim 10 wherein the light bar is used to further cure the relief image after step (b).

* * * * *